(12) United States Patent
Davis et al.

(10) Patent No.: US 9,516,793 B1
(45) Date of Patent: Dec. 6, 2016

(54) MIXED-MODE DATA CENTER CONTROL SYSTEM

(71) Applicant: Google Inc., Mountain View, CA (US)

(72) Inventors: Alan Howard Davis, Mountain View, CA (US); Shane R. Nay, San Jose, CA (US)

(73) Assignee: Google Inc., Mountain View, CA (US)

( * ) Notice: Subject to any disclaimer, the term of this patent is extended or adjusted under 35 U.S.C. 154(b) by 719 days.

(21) Appl. No.: 13/795,618

(22) Filed: Mar. 12, 2013

(51) Int. Cl.
*H05K 7/20* (2006.01)
*G05D 23/00* (2006.01)
*G06F 1/20* (2006.01)

(52) U.S. Cl.
CPC .......... *H05K 7/20836* (2013.01); *G05D 23/00* (2013.01); *G06F 1/206* (2013.01)

(58) Field of Classification Search
CPC .... G06N 99/005; G06N 5/04; G05B 13/0265; G06F 1/20; G06F 1/206; H05K 7/20709; H05K 7/208; H05K 7/20836; G05D 23/00
USPC ................ 700/276, 277, 278, 282, 299, 300
See application file for complete search history.

(56) References Cited

U.S. PATENT DOCUMENTS

| | | | |
|---|---|---|---|
| 7,010,392 B2* | 3/2006 | Bash .................... | F24F 11/0009 62/177 |
| 7,584,021 B2* | 9/2009 | Bash .................... | G05D 23/192 62/177 |
| 7,726,144 B2* | 6/2010 | Larson ................ | G05D 23/1931 165/104.33 |
| RE42,195 E * | 3/2011 | Bash .................... | F24F 11/0009 62/177 |
| 8,019,477 B2* | 9/2011 | Bash .................... | H05K 7/20836 62/177 |
| 8,305,737 B2* | 11/2012 | Ewing .................... | G06F 1/266 174/59 |
| 8,560,677 B2* | 10/2013 | VanGilder ............... | G06F 1/206 700/300 |
| 8,755,948 B2* | 6/2014 | Bower, III ......... | G05D 23/1934 700/300 |
| 2003/0193777 A1* | 10/2003 | Friedrich ................ | G06F 1/206 361/679.53 |
| 2005/0023363 A1* | 2/2005 | Sharma .............. | H05K 7/20745 236/49.3 |
| 2005/0278069 A1* | 12/2005 | Bash .................... | F24F 11/0009 700/276 |
| 2005/0278070 A1* | 12/2005 | Bash .................. | H05K 7/20836 700/276 |
| 2006/0161307 A1* | 7/2006 | Patel .................... | F24F 11/0086 700/277 |

(Continued)

*Primary Examiner* — Charles Kasenge
(74) *Attorney, Agent, or Firm* — Lerner, David, Littenberg, Krumholz & Mentlik, LLP

(57) ABSTRACT

A method and apparatus are provided for controlling the operation of a data center wherein a computer cluster, managing terminal, and an interface device are deployed to control the operation of a data center component. The computer cluster, managing terminal, and the interface device take turns in controlling the operation of the data center component in dependence upon changes in the state of a the data center component, or changes in the states of various other groups of data center components. Objectives for the data center may be broken down into sub-objectives to be performed by portions of the data center.

16 Claims, 11 Drawing Sheets

(56) References Cited

U.S. PATENT DOCUMENTS

| | | | |
|---|---|---|---|
| 2008/0104985 A1* | 5/2008 | Carlsen | F24F 11/0009 62/228.4 |
| 2008/0140259 A1* | 6/2008 | Bash | G05D 23/192 700/278 |
| 2009/0031148 A1* | 1/2009 | Densham | G06F 1/189 713/300 |
| 2009/0234512 A1* | 9/2009 | Ewing | H04L 12/10 700/295 |
| 2011/0077795 A1* | 3/2011 | VanGilder | G06F 1/206 700/300 |
| 2011/0107332 A1* | 5/2011 | Bash | G06F 1/206 718/1 |
| 2012/0123595 A1* | 5/2012 | Bower, III | G05D 23/1934 700/282 |
| 2013/0025818 A1* | 1/2013 | Lyon | H01L 23/473 165/11.1 |
| 2013/0098593 A1* | 4/2013 | Busch | H05K 7/20209 165/200 |
| 2013/0103210 A1* | 4/2013 | Brey | G05D 23/19 700/282 |

* cited by examiner

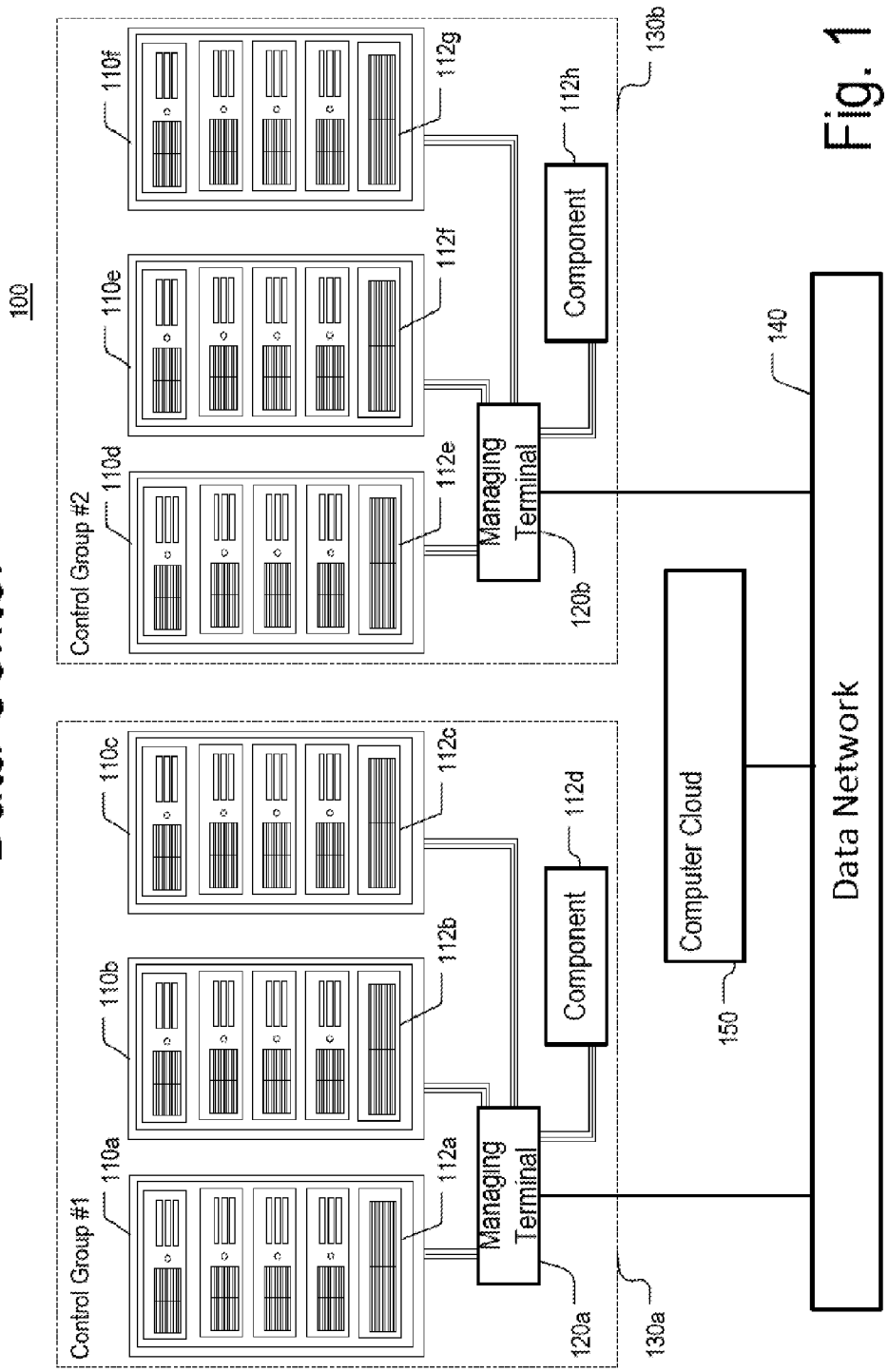

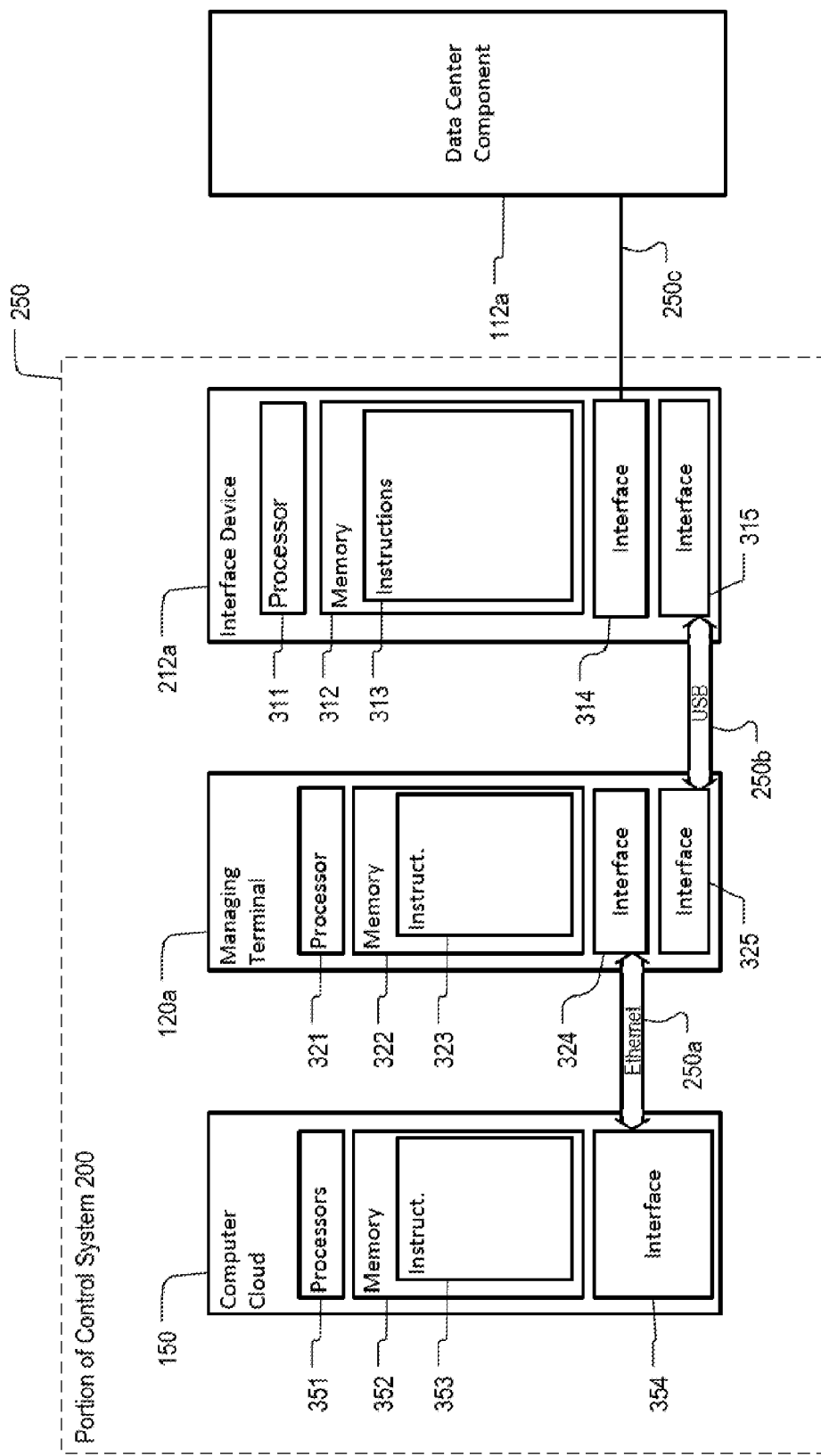

Fig. 5A

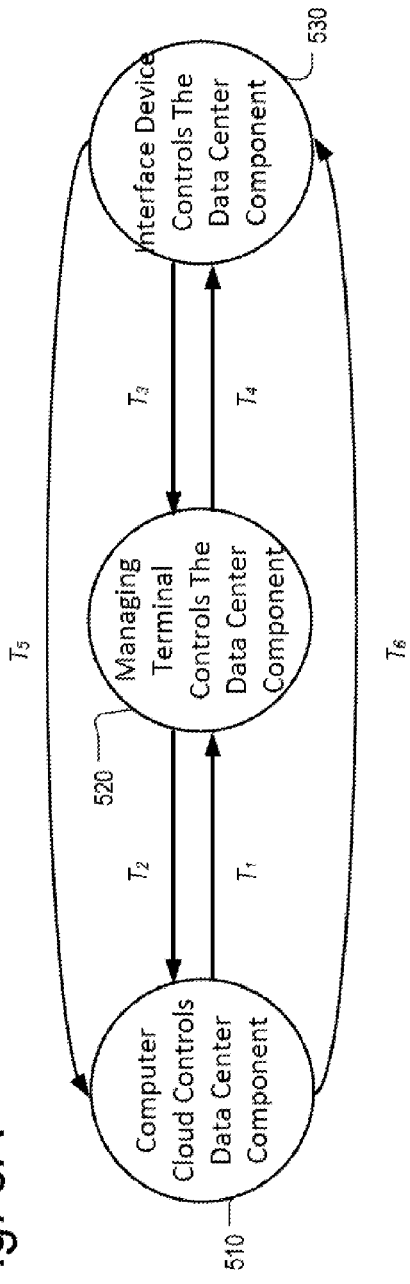

State 510  A: Computer cloud generates a control signal and transmits it to the managing terminal.
          B: Managing terminal receives the generated control signal and relays it to the interface device.
          C: Interface device receives the relayed control signal and further relays it to a data center component.
          D: Data center component receives the relayed control signal and changes at least one aspect of its operation in response.

State 520  A: Computer cloud does not participate in generating a control signal used for controlling the data center component.
          B: Managing terminal generates a control signal and transmits it to the interface device.
          C: Interface device receives the generated control signal and relays it to the data center component.
          D: Data center component receives the relayed control signal and changes at least one aspect of its operation in response.

State 530  A: Computer cloud does not participate in generating a control signal used for controlling the data center component.
          B: Managing terminal does not participate in generating a control signal used to control the data center component.
          C: Interface device generates a control signal and transmits it to the data center component.
          D: Data center component receives the control signal and changes at least one aspect of its operation in response.

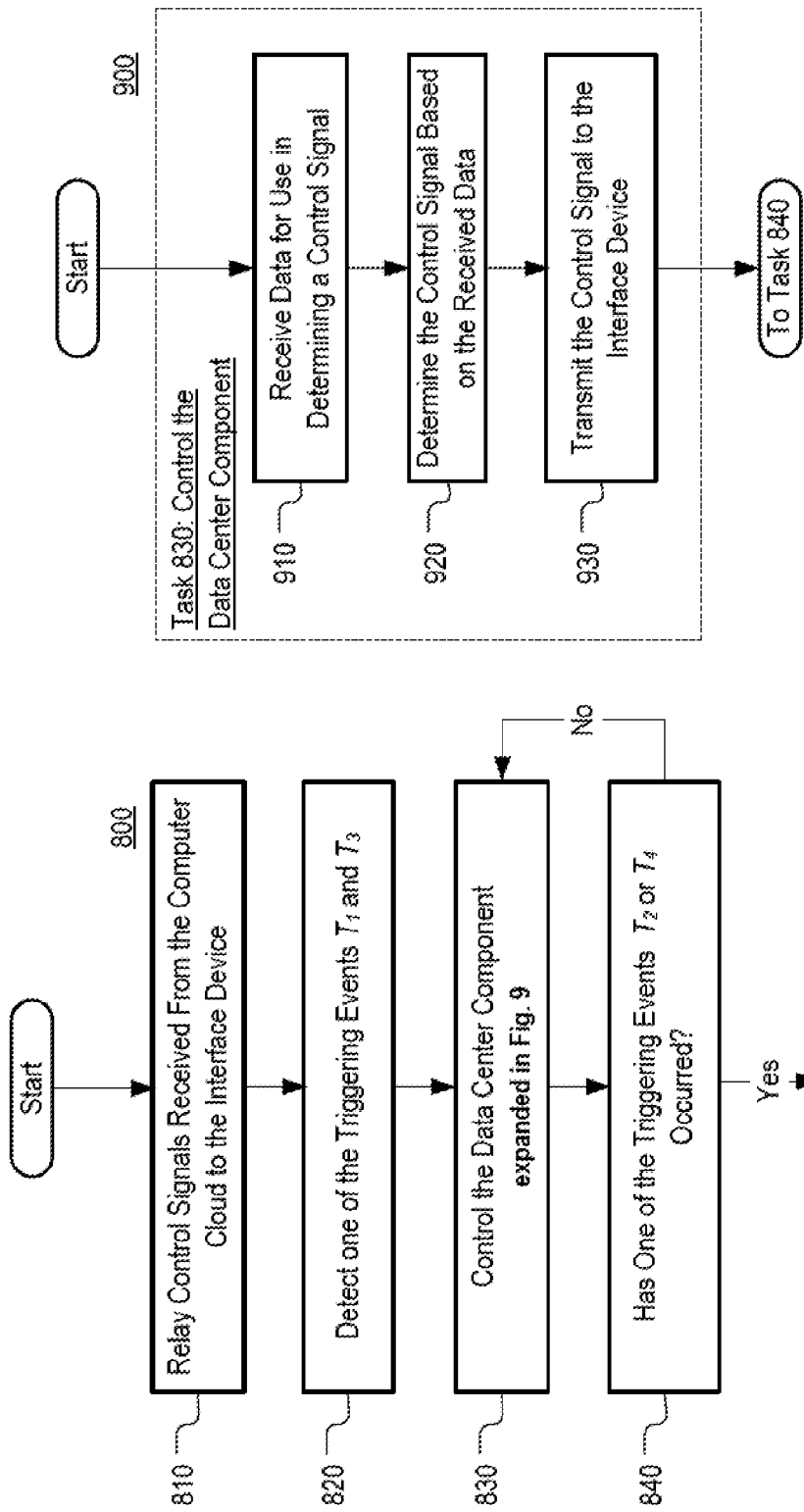

MIXED-MODE DATA CENTER CONTROL SYSTEM

BACKGROUND

Data centers house large numbers of servers and other communications equipment. An average data center may include hundreds of thousands of servers and support systems. Their size may give data centers a great demand for electricity, with some data centers exceeding the power usage of small towns. The sheer scale of some data centers' power consumption may cause considerable monetary savings to be realized from even small improvements in energy efficiency. Support systems in data centers may account for as much as half of the data centers' power consumption and these systems may waste energy when they are not operated efficiently. For example, cooling systems may overcool data centers beyond what is necessary and lighting systems may be activated in places where no people are present.

SUMMARY

To address such inefficiencies, automated control systems may be deployed to determine the most efficient rate of operation for various cooling systems or decide what sections of the data centers should be illuminated. By adding precision to the operation of different data center components, the automated control systems may reduce the amount of electricity data centers consume.

In another aspect, a data center is provided that includes a plurality of servers that form a computer cluster, a cooling device, and a managing terminal. The managing terminal is configured to receive a first control signal from the computer cluster and relay the first control signal towards the cooling device when the computer cluster is in control of the cooling device. The managing terminal is further configured to detect a triggering event, assume control over the cooling device in response to detecting the triggering event, generate a second control signal for controlling the cooling device, and forward the second control signal to the cooling device. When the computer cluster is in control of the cooling device, the operation of the cooling device is regulated with the first control signal. When the managing terminal is in control of the cooling device, the operation of the cooling device is regulated with the second control signal. The computer cluster and the managing terminal may use different control logic to generate the first control signal and the second control signal.

The data center may further include an interface device configured to control the cooling device when neither the managing terminal nor the computer cluster is in control of the cooling device. Detecting the triggering event may include receiving, by the managing terminal, a message from the computer cluster instructing the managing terminal to assume control over the cooling device. Alternatively, detecting the triggering event may include detecting that a predetermined time period has expired without the first control signal being received at the managing terminal.

In some instances, the computer cluster may be configured to generate the first control signal based on a first data set, the first data set including one or more signals from a component of the data center. The managing terminal may be configured to generate the second control signal based on a second data set that is different from the first data set, the second data set not including the one or more signals that are found in the first data set.

In yet another aspect, a method is provided that includes controlling a data center component with a first control signal that is determined by an interface device coupled to the first data center component. The first control signal is based on a feedback signal from the data center component and a constraint on the operation of the data center component that is specified by a managing terminal coupled to the interface device. The method further includes controlling the data center component with a second control signal, when the first control signal is not used to control the data center component. The second control signal is generated by the managing terminal based on feedback signals from a first plurality of data center components that are controlled using the same managing terminal as the data center component and a constraint on the operation of the first plurality of data center components that is specified by a computer cluster coupled to the managing terminal. The method further includes controlling the data center component with a third control signal when the first and second control signals are not used to control the data center component. The third control signal is generated by the computer cluster based on feedback signals from a second plurality of data center components, the data center components from the second plurality being controlled by different managing terminals.

The method may further include switching, based on one or more triggering events, between controlling the data center component with the first control signal, controlling the data center component with the second control signal, and controlling the data center component with the third control signal. The first control signal may further be generated using a first control logic and the second control signal may further be generated using a second control logic, the second control logic being different from the first control logic. At least one of the triggering events is based on the availability of at least one of the computer cluster and the managing terminal.

The method may further include relaying, by the managing terminal, the first control signal to the interface device when the first control signal is used to control the operation of the data center component. The method may further include relaying, by the interface device, the first control signal to the data center component when the first control signal is used to control the operation of the data center component. The method may further include relaying, by the interface device, the second control signal to the data center component when the second control signal is used to control the operation of the data center component.

BRIEF DESCRIPTION OF THE DRAWINGS

FIG. 1 depicts a schematic diagram of a data center in accordance with aspects of the disclosure.

FIG. 3 depicts a partial diagram of the control system of FIG. 2A in accordance with aspects of the disclosure.

FIG. 5A depicts a state machine diagram for the control system of FIG. 2A in accordance with aspects of the disclosure.

FIG. 8 depicts a flowchart of another example process in accordance with aspects of the disclosure.

FIG. 9 depicts a flowchart of subtasks associated with the process of FIG. 8.

DETAILED DESCRIPTION

Figure 2A:
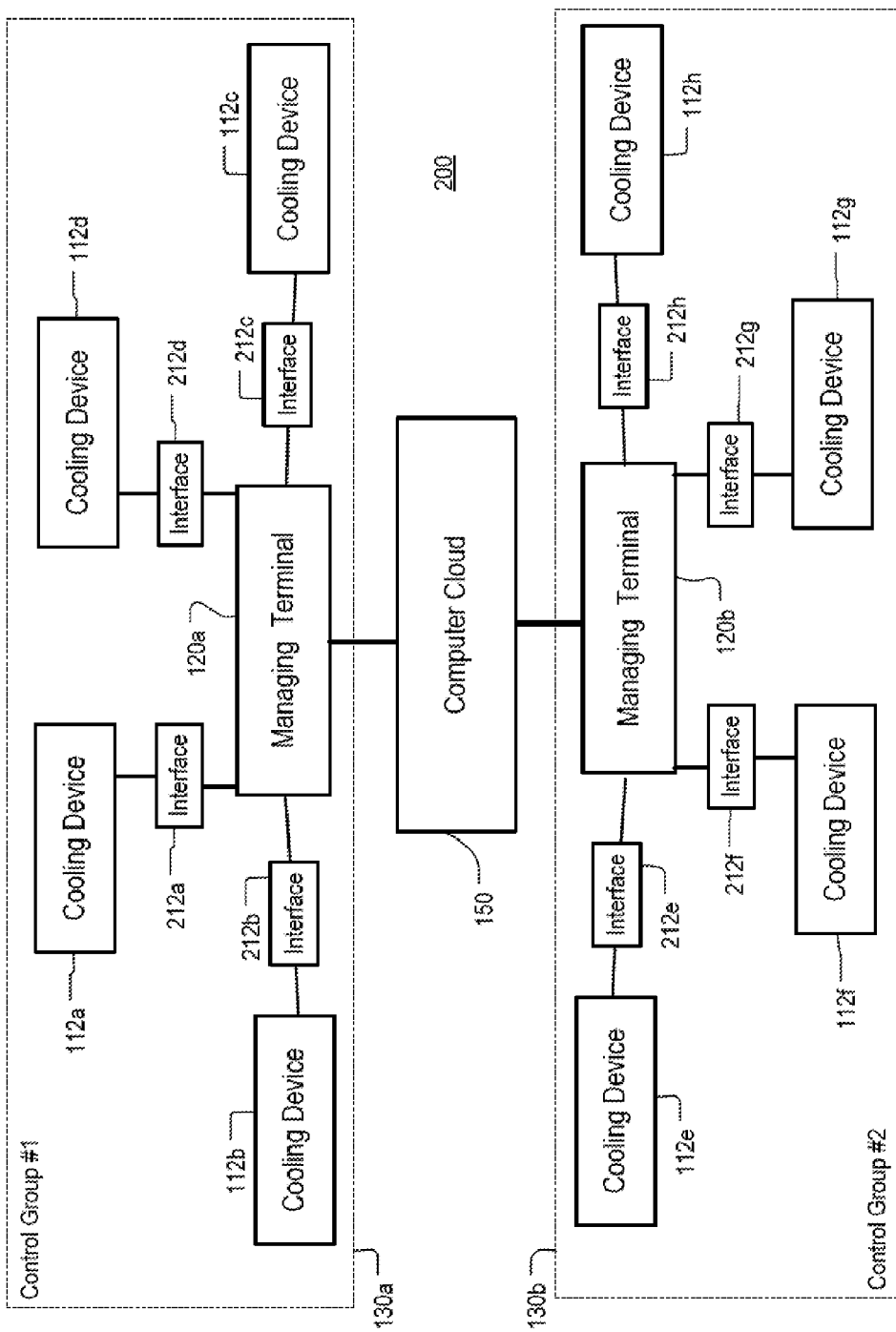
FIG. 2A depicts a control system used to operate the data center of FIG. 1.

FIG. 1 depicts a schematic diagram of a data center 100 in accordance with aspects of the disclosure. The data center 100 may include server racks 110a-f, managing terminals 120a-b, data center components 112a-h, a computer cluster 150, and a communications network 140. Each of the server racks 110a-f may include a plurality of servers. Each of the servers in a given rack may include one or more processors, memory and other components typically found in computer equipment. The computer cluster 150 may be a computer cloud, or another similar distributed system. The components 112a-h may include systems needed for the operation of the data center 100, such as cooling systems, air conditioners, water chilling systems, battery backup systems, power conversion systems, lighting systems and other power consuming devices. The components may further include power generation devices as well. In the present example, the components 112a-h may be cooling devices, such as server rack cooling units, air conditioners, water chillers, or other devices used in maintaining the temperature of the data center 100 or individual equipment, such as server cases, server racks, or switches.

The computer cluster 150, in some aspects, may include servers from the server racks 110a-f. The communications network 140 may connect the computer cluster 150 to the managing terminals 120a-b. The network 140 may include a TCP/IP network, Ethernet, InfiniBand, or other type of network. The components 112a-h may be organized into control groups. As shown, the components 112a-d may be part of the control group 130a and the components 112e-h may be part of the control group 130b. The components in the control group 130a may be controlled using the managing terminal 120a, and the components in the control group 130b may be controlled using the managing terminal 120b. Dividing the management of the data center 100 into control groups may increase the efficiency and scalability of the data center 100.

The components 112a-h may account for a significant portion of the power consumption the data center 100. If the components 112a-h are not efficiently operated, they may cool the data center 100 in excess of what is needed. Automatic control systems may prevent overcooling and associated energy waste. Such automatic control systems may employ control logic for determining proper levels of operation of the components 112a-h.

FIG. 2A depicts a schematic diagram of a control system 200 that may be used to control the components of the data center 100. The control system 200 may include the computer cluster 150, the managing terminals 120a-b, and interface devices 212a-h. The control system 200 may control the operation of the components 112a-h by using control signals. The control signals may be any type of signal that is capable of causing at least one of the components 112a-h to transition from one state to another. The control signals may be used to activate or stop actuators, close or open electrical switches, set modes of operation, etc. By way of example, the control signals may be analog signals or digital signals, such as bit strings or character strings.

Control signals may be delivered to the components 112a-h via the interface devices 212a-h. In some aspects, the interface devices 212a-h may be used to generate control signals based on signals provided by the managing terminals 120a-b or the computer cluster 150. By using circuitry, such as digital-to-analog converters (DACs), the interface devices 212a-h may produce analog signals having a specified voltage, current, frequency, or other characteristic, which the computer cluster 150 or the managing terminals 120a-b cannot by themselves produce. Yet further, the interface devices 212a-h may translate control signals generated by the computer cluster 150 or the managing terminals 120a-b from one format to another (e.g., little endian to big endian) or from one protocol to another (e.g., Ethernet to USB). The interface devices 212a-h may provide control signals based on signals from the managing terminals 120a-b or the computer cluster 150 by providing the signals from the managing terminals 120a-b or the computer cluster 150 without translation or other modifications.

Figure 2B:
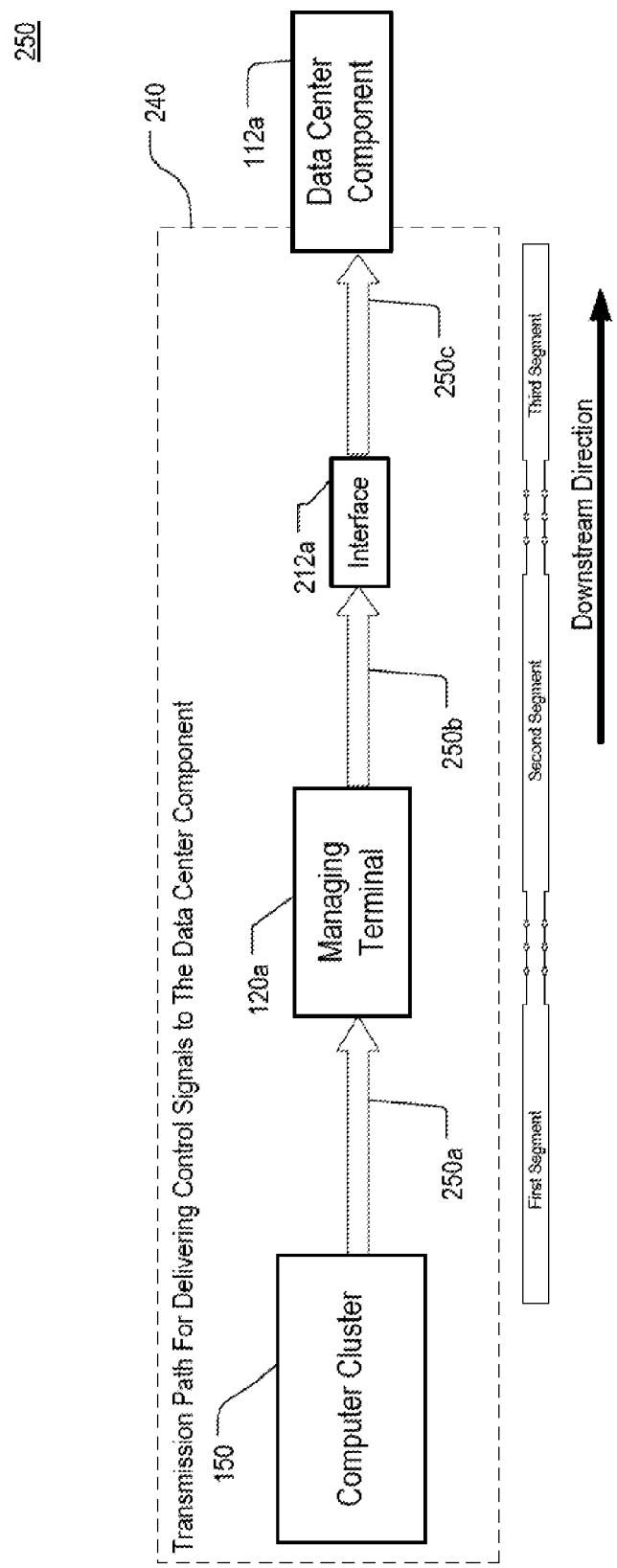
FIG. 2B depicts a portion of the control system of FIG. 1 in accordance with aspects of the disclosure.

FIG. 2B depicts a portion 250 of the control system 200 in accordance with one aspect of the disclosure. Shown are the computer cluster 150, the managing terminal 120a, the interface device 212a, and the data center component 112a. As illustrated, the computer cluster 150, the managing terminal 120a, and the interface device 212a are connected in series to the data center component 112a. Specifically, the computer cluster 150 is connected to the managing terminal 120a via a connection 250a, the managing terminal 120a is connected to the interface device 212a via a connection 250b, and the interface device 212a is connected to the data center component 112a via a connection 250c.

The connection 250a may be a network connection (e.g., connection implemented using the network 140), data bus connection (e.g., serial, USB, FireWire, sATA, or parallel), analog connection, or other type of connection. The connection 250b may be a network connection, a data bus connection, an analog connection, or other type of connection. The connection 250 may be a network connection, data bus connection, analog connection, or other type of connection. In this example, the connection 250a may be a network connection, the connection 250b may be USB connection, and the connection 250c may be an analog connection. Although in this example, connections 250a, 250b, and 250c are all different types of connections in other examples, some or all of them may be the same type of connection (e.g., a network connection).

Transmission path 240 is a path over which control signals are transmitted, in a downstream direction, to the data center component 112a. As illustrated, the transmission path 240 may include the computer cluster 150, the managing terminal 120a, the interface device 112a, as well as the connections 250a-c. In this example, the transmission path includes three segments. The first segment may span between the computer cluster 150 and the managing terminal 120a and it may be implemented using the connection 250a. The second segment may span between the managing terminal 120a and the interface device 212a and it may be implemented using the connection 250b. The third segment may span between the interface device 212a and the data center component 112a and it may be implemented using the connection 250c.

In one aspect, when a control signal is transmitted along the transmission path 240 in the downstream direction, the control signal, in some instances, may assume different protocol modalities. For example, a control signal originating from the computer cluster 150 may be a TCP/IP message when traversing the first path segment, a USB message when traversing the second path segment, and an analog wave when traversing the third segment. Similarly, a control signal originating from the managing terminal 120a may be a USB message when traversing the second segment and an analog wave when traversing the third segment.

In another aspect, when a control signal is transmitted in a downstream direction along the transmission path, it may assume different semantic modalities. For example the computer cluster 150 may transmit a control signal to the managing terminal 120a instructing the managing terminal to limit the power consumption of all devices in the control group 130a to 110 KWh. In response, the managing terminal 120a may transmit a control signal instructing the interface device 212a to spin a fan of the data center component 112a at 3500 RPM. Spinning the fan at 3500 RPM, and not more, may be necessary in order to keep the combined power consumption of the cluster 130a under the specified limit. In response to receiving the instruction, the interface device 212a may generate and output a 13.3V DC signal to the fan of the component 112a, wherein the 13.3V DC is the voltage needed to keep the fan spinning at 3500 RPM.

In yet another aspect, feedback signals generated by the data center component 112a (e.g., temperature readings, error codes) may be transmitted in an upstream direction along the transmission path. For example, the interface device 212a may forward any signals it has received from the component 112a to the managing terminal 120a. The managing terminal 120a may in turn forward the feedback signals to the computer cluster 150. The feedback signals may be used, at least in part, by the cluster software 454, terminal software 424, and the interface software 414 (all shown in FIG. 4) as a basis for the generation of control signals. The feedback signals may be used to determine the constraints and/or signal characteristic values that may be part of the control signals. Moreover, feedback signals generated by each one of the components 112a-h may be forwarded towards the computer cluster 150 in the manner described above.

FIG. 3 depicts the portion 250 of the control system 200 in accordance with another aspect of the disclosure. As with FIG. 2B, shown are computer cluster 150, managing terminal 120a, and interface device 212a coupled to data center component 112a. In this example, the computer cluster 150 may include one or more processors 351, memory 352 and other components typically present in computing devices. The processors 351 may include any well-known processors, such as commercially available processors or dedicated controllers such as an ASIC. The processors 351 and the memory 352 may be distributed across a plurality of servers that are part of the data center 100. References herein to a processor refer to both a single processor and collections of processors that may or may not operate in parallel. The servers may be configured to operate in a computer cloud, a distributed computer system, or any other system for distributed computing and/or provisioning of computing resources.

Memory 352 of the computer cluster 150 may store information accessible by the processors 351, including instructions 353 that may be executed by the processors 351. Memory 352 may also include data (not shown) that may be retrieved, manipulated or stored by the processors. The memory may be of any type capable of storing information accessible by the processors 351, such as a hard-drive, memory card, ROM, RAM, DVD, CD-ROM, write-capable, etc. The instructions 353 may be any set of instructions to be executed directly (such as machine code) or indirectly (such as scripts) by the processor. Some or all of the instructions and data may be stored in a location physically remote from, yet still accessible by, the processor. The instructions may be stored in object code format for direct processing by the processor, or in any other computer language including scripts or collections of independent source code modules that are interpreted on demand or compiled in advance. In that regard, the terms "instructions," "steps" and "programs" may be used interchangeably herein.

Interface 354 may include a plurality of network adapters for connecting servers in the computer cluster 150 to each other. In addition, the interface 354 may connect the computer cluster 150 to the managing terminal 120a via the connection 250a. The interface 354 may be an Ethernet interface, a Wifi interface, an InfiniBand interface, or any other wired or wireless interface for exchanging communications. In the present example, the interface 354 may be an Ethernet interface.

The managing terminal 120a may include a processor 321, memory 322, instructions 333, interface 324, and another interface 325. The processor 321 may include any well-known processor, such as commercially available processors. Alternatively, the processor may be a dedicated controller such as an ASIC. Memory 322 may store information accessible by the processor 321, including instructions 323. The memory 322 may be of any type capable of storing information accessible by the processor, such as a hard-drive, memory card, ROM, RAM, DVD, CD-ROM, write-capable memories, etc. The instructions 323 may be any set of instructions to be executed directly (such as machine code) or indirectly (such as scripts) by the processor.

The interface 324 may be a Bluetooth, USB, Ethernet or 802.11 adapter, or any other wired or wireless interface for exchanging communications. Similarly, the interface 325 may be a Bluetooth, USB, Ethernet or 802.11 adapter, or any other wired or wireless interface for exchanging communications. In the present example the interface 324 may be an Ethernet interface and the interface 325 may be a USB interface.

Interface device 212a may include a processor 311, memory 312, instructions 313, interface 315 for connecting to interface 325, and interface 314 for connecting to the data center component 112a. The processor 311 may be an ASIC, FPGA, or any commercially available processor. The memory 312 may be RAM, CD-ROM, or any other type of volatile and non-volatile memory. The instructions 313 may be any set of instructions to be executed directly (such as machine code) or indirectly (such as scripts) by the processor 311. In one example, the interface device 212a may be a processor-based system including an Atmel ATmega32u4 microcontroller.

The interface 314 may include software and/or hardware for transmitting and receiving analog signals, such as a digital-to-analog converter (DAC) or analog-to-digital converter (ADC). For instance, PWM and frequency generation may be employed. Alternatively, the interface 314 may include a One-Wire, I2C, SPI, USB, Bluetooth, Ethernet or 802.11 adapter, or any other wired or wireless interface for exchanging communications. The interface 315 may be a Bluetooth, USB, Ethernet or 802.11 adapter, or any other wired or wireless interface for exchanging communications. In the present example, the interface 315 may be a USB interface and the interface 314 may be an interface for receiving and transmitting analog signals from the component 112*a*.

Figure 4:
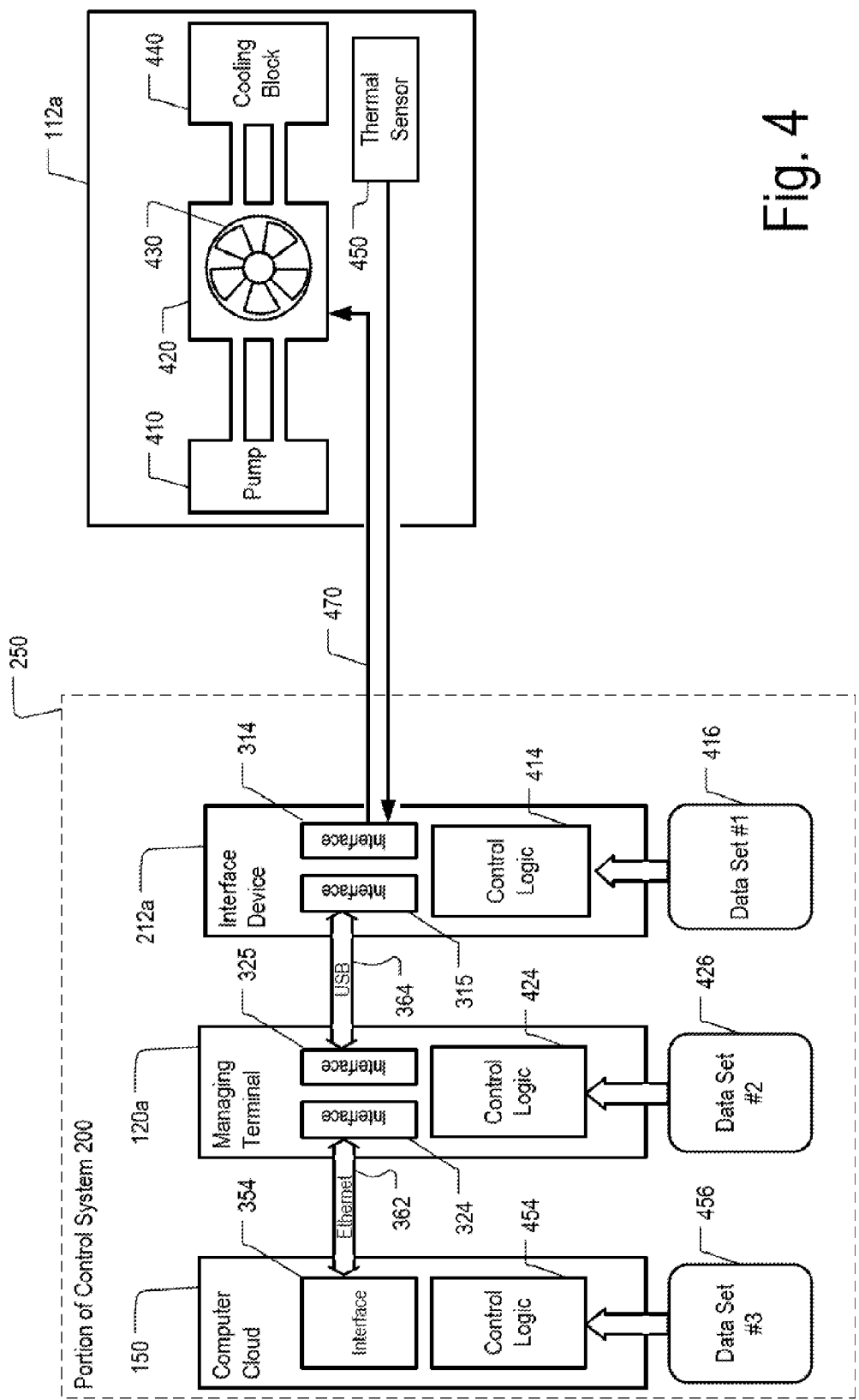
FIG. 4 depicts another partial diagram of the control system of FIG. 2A in accordance with aspects of the disclosure.

FIG. 4 depicts the portion 250 of the control system 200 in accordance with yet another aspect of the disclosure. In this example, the component 112*a* may be a server rack cooling unit including a pump 410 that circulates coolant through a radiator 420 and cooling block 440. To dissipate heat away from the radiator 420, the component 112*a* may use a fan 430. The speed of the fan 430 may be varied using the control signal 470 that is fed to the fan 430 by the control system 200 over the connection 250*c* (shown in FIGS. 2A and 3).

In one aspect, the control signal 470 may be generated by the interface device 212*a* and transmitted over the connection 250*c* (shown in FIGS. 2A and 3). When the control signal 470 is an analog signal, the interface device 212*a* may use the control logic 414 to determine one or more control signal characteristics, such as voltage, frequency, current flow rate, etc. Alternatively, when the control signal 470 is a digital signal, the interface device 212*a* may use the control logic 414 to determine a bit string, number, or character string that constitutes the control signal 470. In either instance, the interface device 212*b* may determine the control signal 470 based on a data set 416. The data set 416 may include the values of one or more feedback signals produced by the component 112*a*, such as one or more readings from sensors that are part of the component 112*a* (e.g., the thermal sensor 450), error codes, status updates, or information that indicates any other state of the component 112*a*. The control logic 414 may be implemented in software (e.g., as part of the instructions 313), in hardware (e.g., as FPGA or other circuitry that is part of the interface device 212*a*), or as a combination of software and/or hardware.

In one example, the control logic 414 may model the speed of the fan 430 as a function of the temperature inside the server rack 110*a*. For instance, the control logic 414 may set the fan 430 to rotate at 1000 RPM when the thermal sensor 450 indicates that the temperature is 20° C. Upon detecting that the temperature rises, the control logic 414 may increase this speed in order provide adequate cooling to the server rack 110*a*. The control logic 414 may increase the speed of the fan 430 to 2000 RPM when the temperature measured by the sensor 450 reaches 40° C. In other words, the control logic may vary the speed of the fan 430 by changing one or more characteristics (e.g., voltage) of the control signal 470.

In another aspect, the control signal 470 may be generated by the managing terminal 120*a*. When the control signal 470 is an analog signal, the managing terminal 120*a* may use the control logic 424 to determine one or more control signal characteristics, such as voltage, frequency, current flow rate, etc. Alternatively, when the control signal 470 is a digital signal, the managing terminal 120*a* may use the control logic 424 to determine a bit string, digit, or character string that constitutes the control signal 470. In either instance, the managing terminal 470 may determine the signal 470 based on a data set 426. The data 426 set may include some or all information that is found in the data set 416. In addition, the data set 426 may include information not found in the data set 416. For example, the data set 426 may include information about the state of other components in the control group 130*a*, such as the values of one or more feedback signals from the components 112*b-d*. The feedback signals may include readings from sensors that are part of the components 112*b-d*, error codes, status updates, or any other information output by the components 112*b-d*. The control logic 424 may be implemented in software (e.g., as part of the instructions 323), in hardware (e.g., as an FPGA or other circuitry that is part of the managing terminal 120*a*), or as a combination of software and/or hardware.

In one example, the control logic 424 may model the speed of the fan 430 as a function of the state of another one of the components in the control group 130*a*. For instance, when the component 112*b* fails, the control logic 424 may increase the speed of fan 430 to compensate for the component 112*b*'s failure. In that regard, the control logic 424 may cause the component 112*a* to carry some of the load of the component 112*b* when the latter fails.

In another aspect, the control signal 470 may be generated by the computer cluster 150. When the control signal 470 is an analog signal, the computer cluster 150 may use the control logic 454 to determine one or more control signal characteristics, such as voltage, frequency, current flow rate, etc. Alternatively, when the control signal 470 is a digital signal, the computer cluster 150 may use the control logic 454 to determine a bit string, number, or character string that constitutes the control signal 470. In either instance, the control signal 150 may be determined based on a data set 456. The data set may include some or all of the information found in the data sets 416 and 426. In addition, the data set 456 may include information that is not found in the data sets 414 and 426. For example, the data set 456 may include the values of feedback signals from components outside of the control group 130*a* (that is controlled by the managing terminal 120*a*), such as readings from sensors, error codes, status updates, or other information output by the components 112*e-h*. Furthermore, the data set 456 may include information about the air temperature outside of a building where the data center 100 is housed, information about the state of the power supplied to the data center 100, or any other information relevant to the operation of the data center 100.

In one example, the control logic 454 may model the speed of the fan 430 as a function of the state of the power supplied to the data center 100. For instance, if an insufficient amount of power is supplied, the control logic 454 may set the fan 430, together with fans in the components 112*b-h*, at a lower speed in order to reduce the data center's overall power usage. As another example, the control logic 454 may vary the speed of the fan 430 as a function of the air temperature outside of the data center 100. For example, if the air temperature is low, the control logic may set the fan 430 at a slower speed than it would otherwise if the air was warmer.

The control logic 454 may be implemented in software as part of the instructions 353. In some aspects, the control logic 454 may be executed concurrently with other software, such as search engine software or content delivery software. Thus, the computer cluster 150 may have the dual function of executing both software for providing services to outside clients (e.g. Internet search services, video-on-demand services) and software for controlling the operation of components of the data center 100. Moreover, in some instances, in addition to controlling various support systems, the control logic 454 may control the operation of servers, switches, and other IT equipment. For example, the control logic may bring servers offline and online depending on the rate at which service requests are received at the data center 100.

In some aspects, as noted above, the control logic 414, 424, and 454 may generate the control signal 470 based on different data. By way of example, the control logic 414 may generate the control signal 470 based on feedback signals from components controlled by the interface device 212a (e.g., feedback signal from the sensor 450), but not based on feedback signals from other components. The control logic 424 may generate the control signal 470 based on feedback signals from any of the components in the control group 130a, but not based on feedback signals from components outside of the control group 130a. The control logic 454 may generate the control signal 470 based on feedback signals from any of the components in the data center 100.

In other aspects, the control logic 454, 424, and 414 may implement different algorithms for generating the control signal 470. The control logic 454 may implement algorithms intended to balance the operation of any of the components in the data center 100 in order to bring the data center 100 into a desired cumulative state. The objective for a cumulative state of the data center 100 may be based on the states of any two or more components in the data center 100 that are located in different control groups. Exemplary cumulative states include total power consumption of the components 112a-h, mean power consumption of the components 112c-e, average air temperature in the server racks 110a-f, mean water flow of three or more water cooling systems, average charge rate of two or more battery chargers, average temperature, or any other metric that describes aspects of the operation of two or more components of the data center 100 as a group. For example, a desired cumulative state of the data center 100 may be a state in which the total power consumption of the data center 100 is below a given threshold. Another desired cumulative state of the data center may be to keep the mean water flow within a given range of values.

The control logic 424, by contrast, may execute algorithms capable of changing cumulative states associated only with components in the control group 130a, but not with components outside of the control group 130a. A cumulative state of the control group 130a may be based on the states of any two or more components in the control group 130a. For example, it may be the combined power consumption of the components 112a-d, mean power consumption of the components 112c-d, combined air temperature, mean water flow of three or more water cooling systems, average charge rate of two or more battery chargers, average temperature, or any other metric that describes aspects of the operation of two or more components of the control group 130a as a group. For example, a desired cumulative state of the cluster 130a may be a state in which the total power consumption of the components 112a-d is below a given threshold.

In yet other aspects, the control logic 454, 424, and 414 may differ in their computational complexity. As noted above, the control logic 454 may balance the control signals fed to the components 112a-h such as to bring the data center 100 into a desired cumulative state. Keeping track of the cumulative state of the data center 100 and then factoring the states of additional data center components when generating the control signal 470 may be beyond the processing capabilities of the interface device 212a and the managing terminal 120a when the number of the additional data center components is large. The computer cluster 150, which combines the processing power of multiple servers, however may have sufficient resources to perform the above tasks.

Furthermore, the control logic 414, 424, and 454 may differ in their function. For example, the control logic 414 may be capable of controlling only components connected to the interface device 212a (e.g., only the component 112a). The control logic 424 may be capable of controlling only components that are connected the managing terminal 120a, such as the components in the control group 130a. And the control logic 454 may by capable of controlling any component in the data center 100. In some aspects, this difference may be due to the topology of the control system 200. As FIG. 2 illustrates, the interface device 212a may be connected, to the component 112a, but not to other components. Similarly, the managing terminal 120a may be connected to components 112a-d, but not to the components 112e-f in the control group 130b.

FIG. 5A depicts a state machine diagram for the control system 200 in accordance with aspects of the disclosure. In this example, the control system 200 changes between states 510, 520, and 530. In the state 510, the computer cluster 150 controls the component 112a. The computer cluster 150 may execute the control logic 454 to determine the control signal 470. The computer cluster 150 may then transmit the control signal 470 to the managing terminal 120a, which in turn may forward it to the interface device 212a for a subsequent transmittal to the component 112a.

For example, while the control system 200 is in the state 510, the computer cluster 150 may execute the control logic 454 and determine that a 5V signal should be supplied to the component 112a. The computer cluster may then generate a text message including the string "5V" and transmit the text message over the connection 250a to the managing terminal 120a. The managing terminal 120a, may then forward the text message over the connection 250b to the interface device 212a. The interface device 212a may produce an analog signal having the voltage specified in the text message and feed the produced analog signal to the component 112a.

The control system 200 may remain in the state 510 until one of a triggering event $T_1$ and a triggering event $T_6$ occurs. The triggering event $T_1$ may include the computer cluster 150 running out of resources to execute the control logic 454, such as CPU time or memory. Alternatively, the triggering event $T_1$ may include a failure of the computer cluster 150, a failure of the connection between the computer cluster 150 and terminal 120a, or a failure of the control logic 454. Furthermore, the triggering event $T_1$ may include an expiration of a timer at the managing terminal 120a as a result of the computer cluster 150 failing to transmit a control signal to the managing terminal 120a within a predetermined time period. When the triggering event $T_1$ occurs, the control system 200 may transition into the state 520.

The triggering event $T_6$ may include the component 112a reaching a predetermined state. For example, a predetermined state of the component 112a may be the sensor 450 of the component 112a measuring a temperature of 50° C. thereby indicating that the server rack 110a is beginning to overheat. When the temperature sensor measures the temperature, the control system 200 may transition into a state 530 where the interface device 212a controls the component 112a. In some aspects, the control logic 414 executed by the interface device 212a may be less complex and therefore more reliable than the control logic 454. This may be especially so when an emergency is taking place. In that regard, when the triggering event $T_6$ occurs, transitioning into the state 530 from the state 510 may increase the reliability of the control system 200.

In the state 520, the managing terminal 120a controls the operation of the component 112a without the participation of the computer cluster 150. While the control system 200 is in the state 520, the managing terminal 120a may determine the control signal 470 using the control logic 424. The managing terminal 120a may then transmit the control signal 470 to the interface device 212a for a subsequent transmittal to the component 112a. For example, the managing terminal 120a may execute the control logic 424 and determine that a 7V signal should be supplied to the component 112a. The managing terminal 120a may then produce a text message including the string "7V" and transmit the text message to the interface device 212a. The interface device 212a may produce an analog signal having the voltage specified in the text message and feed the produced signal to the component 112a.

The control system 200 may remain in the state 520 until one of a triggering event $T_2$ and triggering event $T_4$ occurs. The triggering event $T_2$ may include the data center 100 entering a predetermined cumulative state. Moreover, the triggering event $T_2$ may include receiving a message from the control logic 454 indicating that the control logic 454 is resuming control over the component 112a. When the triggering event $T_2$ occurs, the control system 200 may transition into the state 510.

The triggering event $T_4$ may include a failure of the managing terminal 120a, a failure of the connection between the managing terminal 120a and the interface device 212a, a failure of the control logic 420, or entering by the component 112a into a predetermined state. Furthermore, the triggering event $T_2$ may include an expiration of a timer at the interface device 212a as a result of the managing terminal 120a failing to transmit a control signal to the interface device 212a within a predetermined time period. When the triggering event $T_4$ occurs, the control system 200 may transition into the sate 530.

In the state 530, the interface device 212a controls the operation of the component 112a without the participation of the computer cluster 150 and the managing terminal 120a. While the control logic 200 is in the state 530, the interface device 212a may use the control logic 414 to determine the control signal 470. The interface device 212a may then feed the control signal 470 directly into the component 212a.

The control system 200 may remain in the state 530 until triggering event $T_3$ or a triggering event $T_5$ occurs. The triggering event $T_3$ may include the control group 130a reaching a predetermined cumulative state. The cumulative state may be a state marked by excessive power usage by the components 112a-d. In some aspects, the managing terminal 120a may monitor the control group 130a and detect when the control group 130a enters the predetermined cumulative state. The managing terminal 120a may then transmit a message to the interface device 212a indicating that it is assuming control over the component 112a and causing the control system 200 to enter the state 520. When the control system 200 is in the state 520, the managing terminal 120a may harmoniously coordinate the operation of the components 112a-d in order for them to reach a target for total power consumption, as a group, while each of them continues to serve its purpose to a satisfactory degree by cooling one of the server racks 110a-d. By contrast, the interface device 212a may lack this capability. In that regard, it may be advantageous for the managing terminal 120a to take control over the component 112a when the operation of the control group 130a, as a unitary body, needs adjustment.

The triggering event $T_5$ may include the data center 100 entering a predetermined cumulative state. The predetermined cumulative state may be a state of excessive total power use by the components 112a-h. In some aspects, the computer cluster 150 may monitor the data center 100 and detect when the data center 100 enters the predetermined cumulative state. The computer cluster 150 may then transmit a message to the interface device 212a indicating that it is assuming control over the component 112a and causing the control system 200 to enter the state 510. When the control system 200 is in the state 510, the control logic 454 of the computer cluster 150 may balance the operation of the components 112a-h in a manner that results in them, as a group, beginning to consume less power while each of them continues to maintain its server rack cooled at a safe temperature. Unlike the control logic 454, the control logic 424 and 414 may lack this capability. In that regard, it may be preferable for the computer cluster 150 to take charge of the component 112a when the data center 100 enters an undesirable cumulative state, such as the one in this example.

Figure 5B:
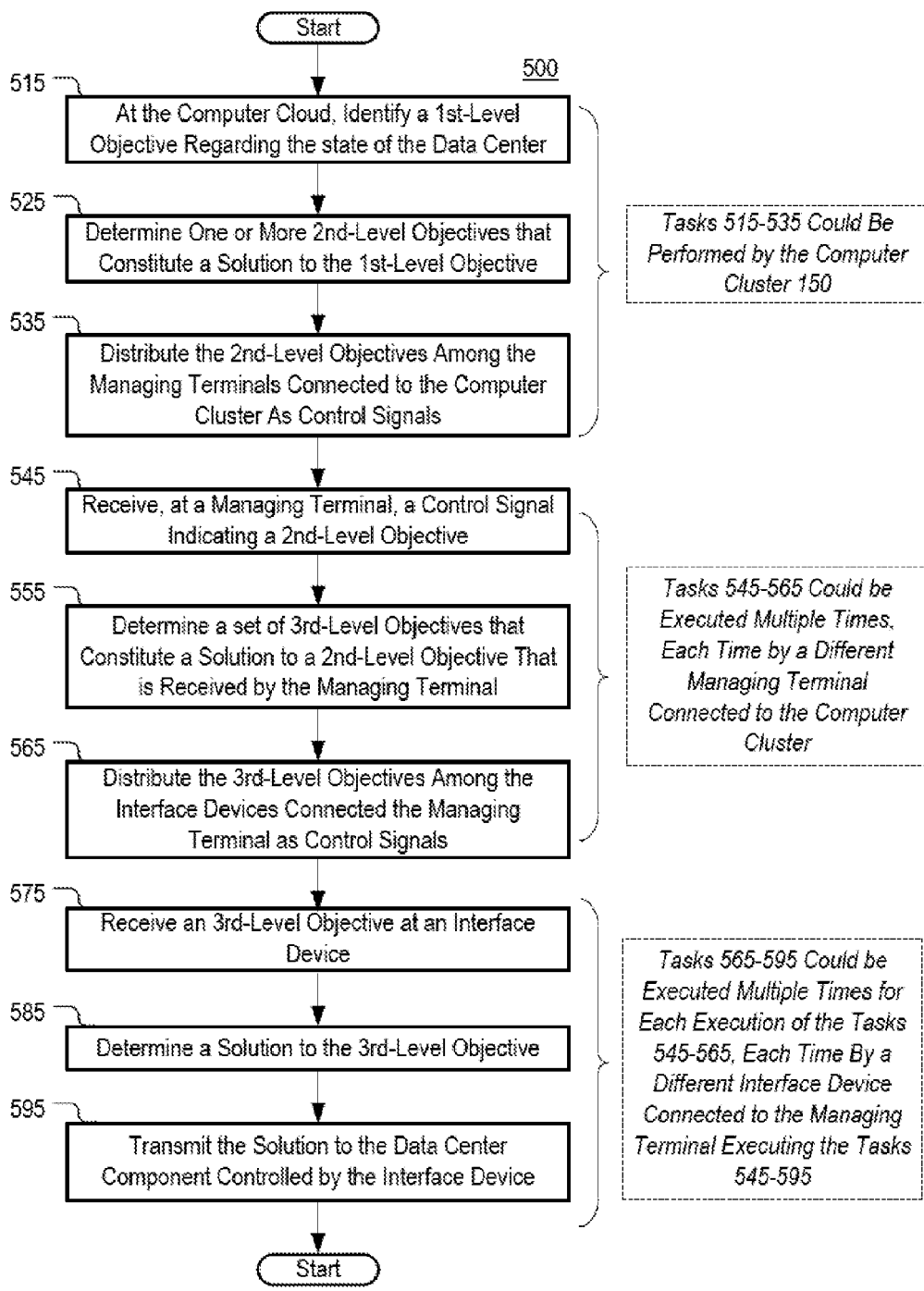
FIG. 5B depicts flowchart of a process performed by the control system of FIG. 2A in accordance with aspects of the disclosure.

FIG. 5B depicts a flowchart of a process 500 associated with the operation of the control system 200 in accordance with another aspect of the disclosure. At task 515, the computer cluster 150 identifies a 1st-level objective regarding the state of the data center 100. In one example, the 1st-level objective may be: "keep the total operating cost of the data center 100 under three thousand dollars ($3000) per hour." At task 525, the computer cluster 150, using the control logic 454, determines a solution to the 1st-level objective. The solution may come in the form of a set of one or more 2nd-level objectives, such that if each of the 2nd-level objectives is achieved, the 1st-level objective would also be accomplished. For example, the computer cluster 150 may determine that in order to stay within budget, the servers in the data center should collectively consume at most 190 kW, and to accomplish this goal the computer cluster 150 may determine that the control groups 130a and 130b may consume at most 110 kW and 80 kW respectively. Thus, "consume at most 110 kW" and "consume at most 80 kW" may be examples of 2nd-level objectives.

At task 535, the computer cluster 150 transmits the 2nd-level objectives to managing terminals in the data center 100. Each 2nd-level objective may be transmitted to a different one of the plurality of control terminals in the data center 100. The 2nd-level objectives may be transmitted in the form of control signals. In this example, the 2nd-level objective "consume at most 110 kW" may be transmitted to the managing terminal 120a and the 2nd-level objective "consume at most 80 kW" may be transmitted to the managing terminal 120b.

At task 545, the managing terminals 120a and 120b receive the control signals transmitted by the computer cluster 150. At task 555, at least one of the managing terminals 120a-b determines a solution to its respective 2nd-level objective. The solution may be determined by using terminal software, such as the control logic 424. The solution may be a set of one or more 3rd-level objectives, such that if each 3rd-level objective in the set is achieved, the 2nd-level objective will also necessarily be accomplished. For example, the terminal 120a may determine that in order to stay under the allotted power consumption limit and operate its dependent components safely, the following 3rd-level objectives have to be met:

O1: the fan of the data center component 112a must rotate at 3500 RPM,

O2: the fan of the data center component 112b must rotate at 2700 RPM,

O3: the fan of the data center component 112c must rotate at 2300 RPM, and

O4: the fan of the data center component 112*d* must rotate at 2500 RPM.

At task 565, at least one of the managing terminals 120*a-b* transmits one or more of the 3rd-level objectives it has determined at task 555. The 3rd-level objectives may be transmitted to one or more of the interface devices connected to the managing terminal that is executing the transmission. For instance, each 3rd-level objective generated by the managing terminal 120*a* may be transmitted to a different one of the interface devices 212*a-d* that are connected to the managing terminal 120*a*. The 3rd-level objective O1 may be transmitted to the interface device 212*a*, the 3rd-level objective O2 may be transmitted to the interface device 212*b*, the 3rd-level objective O3 may be transmitted to the interface device 212*c*, and the 3rd-level objective O4 may be transmitted to the interface device 212*d*. Each 3rd-level objective may be transmitted as a control signal.

At task 575, at least one of the interface devices 212*a-h* receives a control signal transmitted by its supervisory managing terminal. The control signal, as noted above, may indicate a 3rd-level objective. At task 585, at least one of the interface devices 212*a-h* determines a solution to the 3rd-level objective that it has received at task 575. The solution may be determined by using interface software, such as the interface software 414. The solution determined by each interface device may come in the form of a control signal, which when supplied to the data center component that is controlled with the interface device, causes the data center component to accomplish the 3rd-level objective. For example, the interface device 212*a* may determine that in order to spin the fan 430 at 3500 RPM, the interface device 212*a* has to output a 13.3V signal to the fan (that signal may be used to power the fan, whose speed varies with voltage). Alternatively, the interface device 212*a* may determine that in order to spin the fan 430 at 3500 RPM, the interface device 212*a* needs to output the control code "0101" to a controller of the fan 430.

At task 595, each of the interface devices outputs a signal that is determined at task 585 to the data center component controlled by the interface device. As noted above, each one of the 1st-level, 2nd-level, and 3rd-level objectives may specify a constraint on the operation of a set of one or more data center components. The constraints may require that the set of data center components operate in a manner such that the amount of resources consumed by the group is under/over a threshold, the amount of heat output is under/over a threshold, the amount of work performed is under/over a threshold, the amount of light produced is under/over a threshold, the amount of cooling produced is under/over a threshold, or the cost of operation per unit time is under/over a threshold. These and other operations may affect efficiency as well. In other words, the constraint is not limited to any particular aspect of the operation of one or more data center components.

In one aspect, each subsequent level of objective may specify a constraint on the operation of a subset of the data center components governed by a higher-level associated objective. For example, the 1st-level objective may specify a constraint on the operation a set of data center components (e.g., all components of the data center 100). Each of the 2nd-level objectives may specify a constraint on different subsets of the set of the components in the set governed by the 1st-level objective (e.g., different control groups). Similarly, each of the 3rd-level objectives that correspond to a given 2nd-level objective may place a constraint on a subset of the subset controlled by the 2nd-level constraint (e.g., an individual data center component found in a control group.).

Although in this example three levels of objectives are used, in other examples any number of objective levels may be utilized instead.

Notably, in another aspect, all three control devices may control the data center component 112*a* concurrently and in concert. The interface device 212*a* may have the fastest response time than all three control devices and it may be able to adjust the operation of the component 112*a* at a rate of many times per minute (e.g, 20 Hz). By contrast, the managing terminal 120*a* may have a slower response time than the interface device because it may have to process a larger data set (e.g., data set 426) than any individual interface device. The managing terminal may be able to adjust the operation of the data center component 112*a* just a few times per minute (e.g., 0.1 Hz).

The computer cluster 150 may have an even slower response rate. Because the computer cluster 150 may process data related to tens of thousands of devices in the data center, the computer cluster 150 may be able to adjust the operation of the component 112*a* just once every few minutes. In that regard, the computer cluster 150 may specify various 2nd-level objectives for the different managing terminals in the data center 100 and then a period of time may pass before the 2nd-level objectives are updated. Each managing terminal may update the 3rd-level objective pursued by one or more interface devices several times during that period. Once a 3rd-level objective for a given data center component is specified, that objective may be pursued independently by the interface devices connected to the data center component until the 3rd-level objective is updated.

Figure 5C:
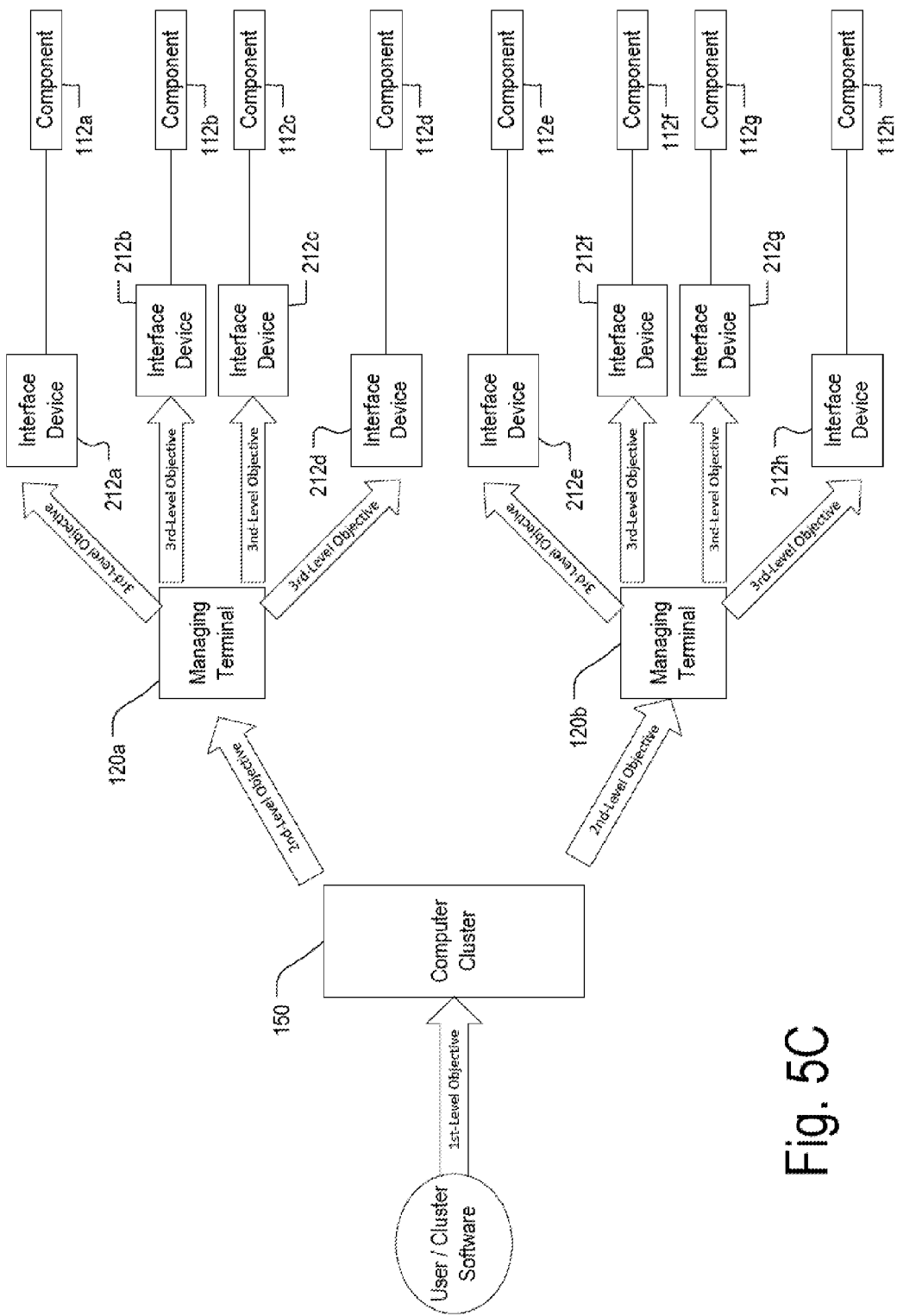
FIG. 5C depicts a schematic diagram illustrating the flow of data within the control system 200.

FIG. 5C illustrates the flow of data in the control system 200. As illustrated different control signals may flow between different elements of the system. Each of the control signals may identify a constraint on the operation of one or more of the components 112*a-h* (e.g., "rotate at 3500 RPM", "control group should consume less than a predetermined amount of power") or alternatively, each control signal may identify a characteristic of a signal that is to be supplied to one or more of the data center components (e.g., 13.3V DC). When a control device (e.g., computer cluster, managing terminal, or interface device) is provided with a constraint, the control device may determine how to satisfy the constraint. For example, the control device may identify a characteristic of a signal which when supplied to a component will cause the component to meet the constraint (e.g., logic-value, voltage, frequency). Alternatively, the control device may derive a set of one or more additional constraints, which, if met, may cause the original constraint to also be met. Each additional constraint may be transmitted further downstream on one or more transmission paths leading to various data center components.

In one aspect, each control device (e.g., computer cluster, managing terminal, and interface device) may micromanage individual data center components. For example, the computer cluster may determine the voltage used to power the fan 430. In other aspects, higher-level control devices may determine various constraints, and only the interface devices may specifically manage individual data center components by determining the exact value of an analog signal or a digital code that is supplied to the individual data center components. In that regard, the control system 200 may employ a combination of the techniques described with respect to FIGS. 5A and 5B.

Figure 6:
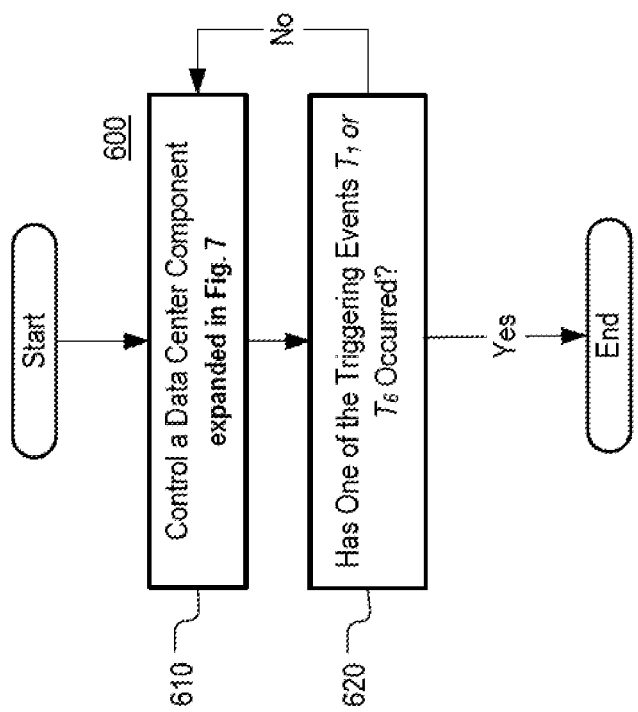
FIG. 6 depicts a flowchart of an example process in accordance with aspects of the disclosure.

FIG. 6 depicts a flowchart of an example process 600 performed by the computer cluster 150. In this example, the computer cluster 150, using the control logic 454, may control the operation of the component 112a (task 610) until one of the triggering events $T_1$ and $T_5$ occurs (task 620). When either one of the two triggering events occurs, the computer cluster 150 may stop controlling the component 112a.

Figure 7:
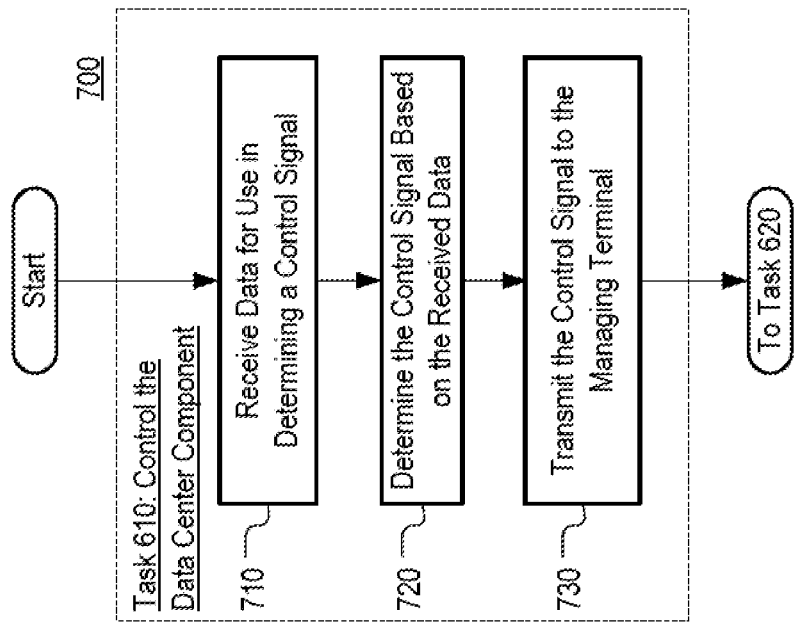
FIG. 7 depicts a flowchart of subtasks associated with the process of FIG. 6.

FIG. 7 depicts a flowchart of subtasks associated with controlling the component 112a as specified by task 610 of FIG. 6. At task 710, the computer cluster 150 receives the data set 456. In some aspects, the computer cluster 150 may receive one or more feedback signals from any of the components in the data center 100. The feedback signals may include error codes, status updates, or sensor feedback signals that indicate temperature, speed of rotation, current flow, or any other metric relating to the operation of different components in the data center 100. The feedback signals may be delivered to the computer cluster 150 by way of data center components providing feedback signals to their respective interface devices, and the respective interface devices forwarding the feedback signals to their respective managing terminals, and the respective managing terminals forwarding the feedback signals to the computer cluster 150.

In addition, the computer cluster 150 may receive information regarding the data center's power supply, or environmental information, such as outside air temperature and humidity. Such information may be obtained from external sources, like weather servers, or servers managed by the power supplier of the data center 100. Alternatively, the same information may be obtained from one or more sensors that are installed in the data center 100.

At task 720, the computer cluster 150, using the control logic 454, processes the data received at task 710 and determines a control signal. As noted above, determining the control signal may include identifying the state(s) that one or more data center components should enter or remain in (e.g., a state where a fan rotates at 3500 RPM or a state where the total power consumption for the control group 130a is 140 kW). At task 730, the computer cluster 150 transmits the control signal to the managing terminal 120a. The transmitted control signal may include an indication of one or more characteristics of the control signal 470 (e.g., voltage, frequency, current flow rate). Alternatively, the control signal may include an indication of a constraint on the operation of the control group 130a.

FIG. 8 depicts a flowchart of an example process 800 performed by the managing terminal 120a. At task 810, the managing terminal 120a relays control signals to the interface device 212a. The relaying may include receiving the control signal transmitted by the computer cluster 150 at task 610 and forwarding it to the interface device 212a. In some aspects, the managing terminal 120a may translate the control signal from a first format to a second format that is compatible with the interface device 212a. In any event and in one aspect, the relaying of the control signal does not require determining, by the managing terminal 120a, of the state(s) that one or more data center components in the control group 130a should enter or remain in (e.g., a state where a fan rotates at 3500 RPM or another cooling unit operates at half of its capacity). Rather, in instances where the managing terminal relays control signals provided by the computer cluster 150, that determination is made by the computer cluster 150.

At task 820, the managing terminal 120a detects one of (1) receipt of a constraint on the operation of the control group 130a from the computer cluster 150 or (2) one of the triggering events $T_1$ and $T_3$. At task 830, in response to the detection at task 820, the managing terminal 120a starts controlling the component 112a. When the managing terminal 120a is in control of the component 112a, the managing terminal 120a determines a control signal by using the control logic 424. The control signal, as is discussed below, may be determined based on at least one of (a) a constraint specified by the computer cluster 150 and (b) feedback signals received at the managing terminal 120a from data center components in the control group 130a. In some instances, the control signal may indicate a constraint on the operation of the data center component 112a. The control signal, as noted above, indicates a state which one or more devices from the control group 130a should enter or remain in (e.g., a state where one or more fans rotates at 3500 RPM or one or more cooling units operate at half-capacity)

When the computer cluster 150 becomes unavailable due to a network failure or another malfunction, as discussed with respect to triggering condition $T_1$, the managing terminal 120a may ignore control signals received from the computer cluster 150 and take complete control over the control group 130a. Taking complete control may include disregarding constraints specified by the computer cluster 150, before the computer cluster 150 becomes unavailable, due to the possibility of such constraints being obsolete. In that regard, in such circumstances, the managing terminal 120a may generate new control signals that are not based on control signals received from the computer cluster 150.

At task 840, when one of the triggering events $T_2$ and $T_4$ occurs, the managing terminal 120a stops controlling the data center component 112a. In some instances, the managing terminal may return to relaying control signals received from the computer cluster 150 as discussed with respect to task 810.

FIG. 9 depicts a flowchart of subtasks associated with task 830 of FIG. 8 in accordance with one example. At task 910, the managing terminal 120a receives the data set 426. In some aspects, the managing terminal 120a may receive one or more feedback signals. The feedback signals may include error codes, status updates, or sensor feedback signals, such as signals from the thermal sensor 450. The sensor feedback signals may indicate temperature, speed of rotation, current flow, or any other metric relating to the operation of data center components in the control group 130a (that is controlled by the managing terminal 120a). The feedback signals may be received by way of components in the cluster 130a providing the feedback signals to their respective interface devices (e.g., interface devices 212a-d), and the respective interface devices forwarding the feedback signals to the managing terminal 120a.

At task 920, the managing terminal, using the control logic 424, processes the data set 426 and determines a control signal. Determining the control signal involves determining a state that one or more devices from the control group 130a should enter or remain in (e.g., a state where one or more fans rotates at 3500 RPM or one or more cooling units operate at half-capacity). In some instances, the control signal may be determined based on at least one of (a) a constraint on the operation of the control group 130a provided by the computer cluster 150 and (b) the feedback received at task 910.

At task 930, the managing terminal 120a transmits the control signal determined at task 920 to the interface device 212a. In some instances, the control terminal 120a may transmit an indication of one or more characteristics of the control signal 470 (e.g., voltage, frequency, current flow rate). Alternatively, the control signal may include an indication of a constraint on the operation of the data center component 112a.

Figure 10:
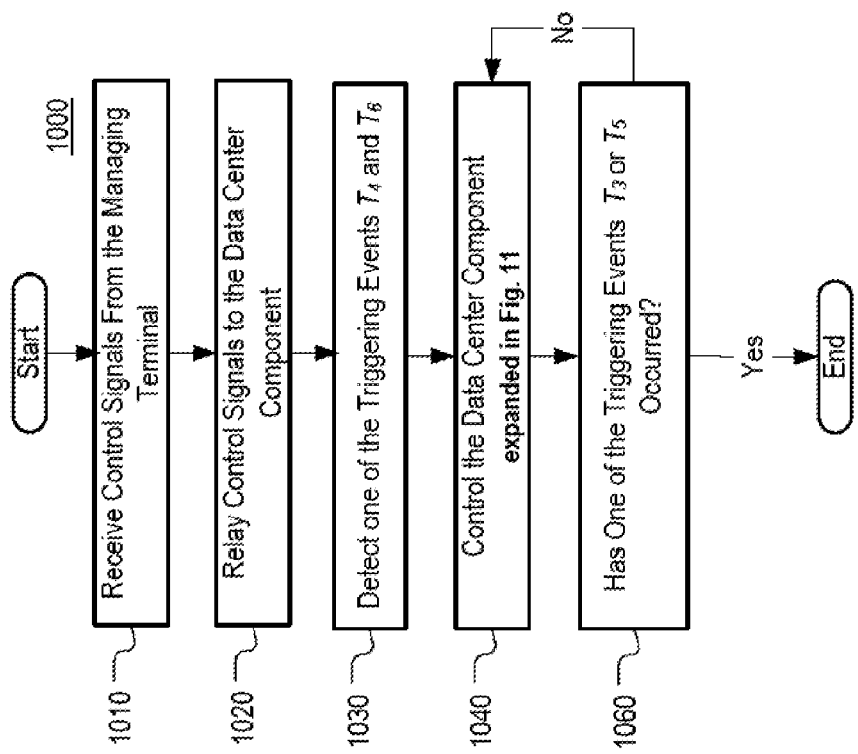
FIG. 10 depicts a flowchart of yet another exemplary process in accordance with aspects of the disclosure.

FIG. 10 depicts a flowchart of an exemplary process 1000 performed by the interface device 212a. At task 1010, the interface device 212a receives a control signal from the managing terminal 120a. The control signal may be transmitted by the control terminal 120a while relaying control signals determined by the computer cluster 150. Alternatively, the control signal may be transmitted by the control terminal 120a while controlling the component 112a as discussed above with respect to task 830.

At task 1020, the interface device 212a relays the control signal received at task 1010 to the component 112a. When the control signal 470 is an analog signal, the interface device 212a may produce an analog signal having one or more characteristics specified in the received indication. When the control signal 470 is a digital signal, the interface device 212a may forward to the component 112a a bit string, character string or another value that is contained in the received indication. In some instances, the interface device 212a may translate the received control signal from a first format to a second format that is compatible with the component 112a. In any event, the relaying of the control signal does not involve determining, by the interface device, the state which the component 112a should enter or remain in (e.g., a state where a fan rotates at 3500 RPM). Rather, in instances where the interface device 212a is relaying control signals provided by the managing terminal 120a, that determination is made by the managing terminal 120a or the computer cluster 150.

At task 1030, the interface device detects one of (1) receipt of a constraint from the managing terminal 120a or (2) one of the triggering events $T_4$ and $T_6$. At task 1040, in response to the detection at task 1030, the interface device 212a starts controlling the component 112a. When the interface device 212a is in control of the component 112a, the interface device 212a determines a control signal using the control logic 414. In some instances, the control signal may be determined based on at least one of (a) a constraint on the operation of the data center component 112a that is provided by the managing terminal 120a and (b) feedback received from the data center component 112a.

When the managing terminal 120a becomes unavailable due to a network failure or another malfunction, as discussed with respect to triggering condition $T_4$, the interface device 212a may ignore control signals received from the managing terminal 120a and take complete control over the data center component 112a. Taking complete control may include disregarding constraints specified by the managing terminal 120a, before the managing terminal becomes unavailable, due to the possibility of such constraints being obsolete. In that regard, in such circumstances, the interface device 212a may generate new control signals that are not based on control signals received from the managing terminal 120a.

Figure 11:
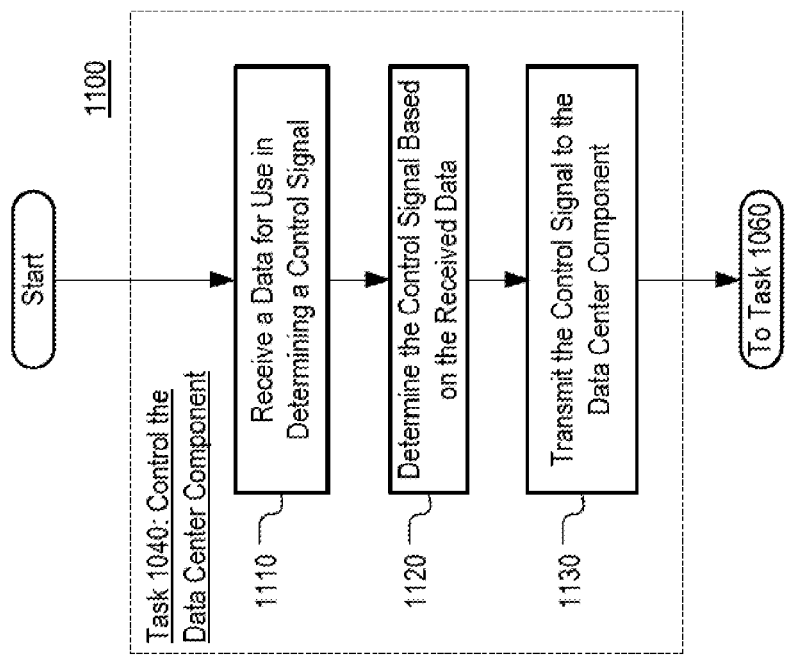
FIG. 11 depicts a flowchart of subtasks associated with the process of FIG. 10.

FIG. 11 depicts a flowchart of subtasks associated with controlling the component 112a as specified by task 1040 of FIG. 10. At task 1110, the interface device 212a receives the data set 416. The interface device may receive one or more feedback signals from the component 112a, such as a signal from the sensor 450. At task 1120, the interface device 212a, using the control logic 414, processes the data received at task 1110 and determines the control signal 470. Determining the control signal involves determining a state which the data center component coupled to the interface should enter or remain in (e.g., a state where a fan rotates at 3500 RPM or another cooling unit operates at half of its capacity). In some instances, the control signal may be determined based on at least one of (a) a constraint on the operation of a data center component or a group of data center components that is provided by the managing terminal 120a and (b) the feedback received at task 1110. In other instances, the control signal may generate the control signal 470 without input from the computer cluster or the managing terminal that is coupled to the interface device. At task 1130, the interface device 212a transmits the control signal 470 to the component 112a.

FIGS. 6-11 are provided as examples. In some aspects, at least some of the tasks associated with FIGS. 6-11 may be performed in a different order than represented, performed concurrently, or altogether omitted. Although in the above examples, the terminal 120a is represented as being a monolithic unit, the processor 321 and memory 322 may actually comprise multiple processors and memories that may or may not be stored within the same physical housing. And, although the managing terminal 120a and the computer cluster are depicted as separate blocks, in some aspects the managing terminal 120a may also participate in the computer cluster 150.

Furthermore, the disclosure is not limited to any specific type of information being present in the data sets 416. The information included in any of these sets may depend on the deployment context of the ideas exposed to this disclosure. Furthermore, although the control logic 414, 424, and 454 are presented as being structurally different, in other examples, the control logic 414, 424, and 454 may all be the same.

Moreover, although in the above examples the automatic control system 200 is used to operate server rack cooling units, in other examples the control system 200 may operate other types of data center support systems, such as water chillers, air conditions, power supply units and lighting systems. The example of a cooling unit in FIG. 4 is provided for illustrative purposes only. Moreover, although the component 112a is controlled with only one control signal, the control system 200 the same principles and ideas may be employed to generate multiple control signals for controlling the same data center component. In addition, the computer cluster 150 and/or the managing terminals 120a-b may be used to control various computer and communications equipment in the data center 100, such as servers and switches. For example, they may bring servers offline when the service load on the data center 100 is low or insufficient power is supplied.

Although, in the above examples the control system 200 includes a computer cluster 150, managing terminals 120a-b, and the interface devices 212a-h, further variations are possible where one of the computer cluster 150, managing terminals 120a-b, and the interface devices 212a-h is omitted. Moreover, yet further variations are possible where additional layers of managing terminals are added. In addition, the control groups 130a and 130b may include any number and type of data center components.

Even though the use of the control logic 414, 424, and 454 is discussed with respect to achieving energy efficiency, in other aspects the control logic 414, 424, and 454 may be optimized to achieve other goals such as safety of operation. The present disclosure is not limited to any type of control logic. Furthermore, the triggering events $T_1$-$T_6$ are provided as examples only. Any pre-determined condition may trigger be used to trigger a state transition by the control system 200. The triggering events may depend on the context in which the control system 200 is deployed, and thus they may be determined, without undue experimentation, by users of the control system 200.

As these and other variations and combinations of the features discussed above can be utilized without departing from the subject matter as defined by the claims, the foregoing description of exemplary aspects should be taken by way of illustration rather than by way of limitation of the subject matter as defined by the claims. It will also be understood that the provision of the examples described herein (as well as clauses phrased as "such as," "e.g.", "including" and the like) should not be interpreted as limiting the claimed subject matter to the specific examples; rather, the examples are intended to illustrate only some of many possible aspects.

The invention claimed is:

1. A data center comprising:
   a plurality of servers, the plurality of servers forming a computer cluster;
   a component device; and
   a managing terminal configured to:
      receive a control signal from the computer cluster,
      provide a first control signal, based on the control signal from the computer cluster, to the component device when the computer cluster is in control of the component device,
      detect a triggering event by detecting that a predetermined time period has expired without the control signal being received from the computer cluster,
      control the component device in response to detecting the triggering event,
      provide a second control signal for controlling the component device, and
      provide the second control signal to the component device when the managing terminal is in control of the component device, the second control signal not being based on the control signal from the computer cluster;
   wherein an operation of the component device is regulated with the first control signal when the computer cluster is in control of the component device;
   wherein the operation of the component device is regulated with the second control signal when the managing terminal is in control of the component device; and
   wherein the computer cluster and the managing terminal use different control logic to provide the first control signal and the second control signal, respectively.

2. The data center of claim 1, further comprising an interface device configured to control the component device when neither the managing terminal nor the computer cluster is in control of the component device.

3. The data center of claim 1, wherein detecting the triggering event comprises receiving, by the managing terminal, a message from the computer cluster instructing the managing terminal to assume control over the component device.

4. The data center of claim 1 wherein the component device is a cooling device.

5. A method for controlling a data center in accordance with a state objective, the data center comprising a plurality of components, each component comprising a server or cooling device, the state objective being selected from the group consisting of consuming an amount of power, performing an amount of cooling and maintaining a temperature, the method comprising:
   receiving a state objective for the data center,
   determining, with a processor, a first state objective for a first portion of the components in the data center,
   determining, with a processor, a second state objective for a second portion of the components in the data center,
   determining, with a processor, a third state objective for a portion of the components in the first portion,
   determining, with a processor, a fourth state objective for another portion of the components in the first portion,
   performing the first state objective at the first portion of the components, and
   performing the second state objective at the second portion of the components,
   performing the third state objective at said portion of components in the first portion, and
   performing the fourth state objective at said another portion of components in the first portion,
   wherein the first state objective and second state objective are determined such that the performance of the first state objective and the performance of the second state objective is intended to result in the components of the data center cumulatively performing the state objective for the data center, and
   wherein the third state objective and fourth state objective are determined based on the first state objective and the processor used to determine the third state objective is different than the processor used to determine the fourth state objective.

6. The method of claim 5 wherein the state objective for the data center comprises the total amount of power consumed by the components of the data center being less than a threshold.

7. The method of claim 5 wherein the cooling devices comprise water cooling components, and the state objective for the data center comprises maintaining the mean water flow of the cooling devices of the data center within a given range.

8. The method of claim 5 wherein the state objective for the data center comprises maintaining the air temperature of the data center within a given range.

9. The method of claim 5 wherein at least one processor used to determine a selected state objective is contained in an interface between a component of the data center and a managing terminal, and wherein the selected state objective is selected from the group consisting of: the first, second, third, and fourth state objective.

10. A method for controlling a data center, the method comprising:
   controlling a first data center component with a first control signal that is determined by an interface device coupled to the first data center component, the first control signal being based on a feedback signal from the data center component and a constraint on the operation of the data center component that is specified by a managing terminal coupled to the interface device;
   when the first control signal is not used to control the data center component, controlling the data center component with a second control signal that is generated by the managing terminal based on feedback signals from a first plurality of data center components that are controlled using the same managing terminal as the data center component and a constraint on the operation of the first plurality of data center components that is specified by a computer cluster coupled to the managing terminal; and
   when the first and second control signals are not used to control the data center component, controlling the data center component with a third control signal that is generated by the computer cluster based on feedback signals from a second plurality of data center components, the data center components from the second plurality being controlled by different managing terminals.

11. The method of claim 10, further comprising:
switching, based on one or more triggering events, between: (A) controlling the data center component with the first control signal, (B) controlling the data center component with the second control signal, and (C) controlling the data center component with the third control signal.

12. The method of claim 11, wherein at least one of the triggering events is based on the availability of at least one of the computer cluster and the managing terminal.

13. The method of claim 10, wherein the first control signal is generated using a first control logic and the second control signal is generated using a second control logic, the second control logic being different from the first control logic.

14. The method of claim 10, further comprising relaying, by the managing terminal, the first control signal to the interface device when the first control signal is used to control the operation of the data center component.

15. The method of claim 10, further comprising relaying, by the interface device, the first control signal to the data center component when the first control signal is used to control the operation of the data center component.

16. The method of claim 10, further comprising relaying, by the interface device, the second control signal to the data center component when the second control signal is used to control the operation of the data center component.

\* \* \* \* \*